US011137289B1

(12) United States Patent
Poli et al.

(10) Patent No.: US 11,137,289 B1
(45) Date of Patent: Oct. 5, 2021

(54) METHOD AND SYSTEM FOR MACHINE LEARNING USING OPTICAL DATA

(71) Applicant: LightOn, Paris (FR)

(72) Inventors: Iacopo Poli, Paris (FR); Julien Launay, Paris (FR); Kilian Müller, Paris (FR); Gustave Pariente, Paris (FR); Igor Carron, Paris (FR); Laurent Daudet, Paris (FR)

(73) Assignee: LightOn, Paris (FR)

( * ) Notice: Subject to any disclaimer, the term of this patent is extended or adjusted under 35 U.S.C. 154(b) by 0 days.

(21) Appl. No.: 16/815,822

(22) Filed: Mar. 11, 2020

(51) Int. Cl.
| | |
|---|---|
| *G01J 3/28* | (2006.01) |
| *G02B 27/28* | (2006.01) |
| *G02B 26/08* | (2006.01) |
| *H01L 27/146* | (2006.01) |
| *G01B 11/16* | (2006.01) |
| *G06N 3/04* | (2006.01) |
| *G06K 9/62* | (2006.01) |
| *G01B 9/02* | (2006.01) |

(52) U.S. Cl.
CPC ........ *G01J 3/2823* (2013.01); *G01B 9/02049* (2013.01); *G01B 11/162* (2013.01); *G02B 26/0833* (2013.01); *G02B 27/283* (2013.01); *G06K 9/6257* (2013.01); *G06N 3/0445* (2013.01); *H01L 27/14643* (2013.01)

(58) Field of Classification Search
CPC . G01B 9/02049; G01B 11/162; G01J 3/2823; G02B 26/0833; G01N 21/4795; G06N 3/0445
See application file for complete search history.

(56) References Cited

U.S. PATENT DOCUMENTS

| 5,621,752 A | 4/1997 | Antonio et al. |
| 10,313,018 B2 | 6/2019 | Gigan et al. |
| | (Continued) | |

FOREIGN PATENT DOCUMENTS

WO 2016/124716 A1 8/2016

OTHER PUBLICATIONS

Wang, Wenjun et al. "Neural Network Control of Liquid Crystal Spatial Light Modulator for Spectral Synthesis of Light". Optical Review, vol. 6, No. 6, 1999, pp. 497-500. (Year: 1999).*

(Continued)

*Primary Examiner* — Michael A Lyons
(74) *Attorney, Agent, or Firm* — Osha Bergman Watanabe & Burton LLP (57) ABSTRACT

A system may include an optical source and an adjustable spatial light modulator coupled to the optical source. The system may further include a medium coupled to the adjustable spatial light modulator. The system may further include a beam splitter coupled to the optical source and the adjustable spatial light modulator. The beam splitter may generate a first optical signal and a second optical signal using the optical source. The system may further include an optical detector coupled to the beam splitter and the medium. The optical detector may obtain a combined optical signal including a resulting optical signal and the second optical signal. The resulting optical signal may be produced by transmitting the first optical signal through the medium at a predetermined spatial light modulation using the adjustable spatial light modulator.

19 Claims, 6 Drawing Sheets

(56) References Cited

U.S. PATENT DOCUMENTS

| | | |
|---|---|---|
| 2010/0123944 A1 | 5/2010 | Ito |
| 2010/0172651 A1 | 7/2010 | Nien et al. |
| 2012/0182558 A1 | 7/2012 | Masumura |
| 2012/0182591 A1* | 7/2012 | Masumura ............ G01N 21/00 359/11 |
| 2015/0036021 A1 | 2/2015 | Gigan et al. |
| 2018/0266890 A1 | 9/2018 | Dholakia et al. |
| 2018/0293716 A1* | 10/2018 | Choi ..................... G06T 5/006 |
| 2018/0367192 A1 | 12/2018 | O'Shea et al. |
| 2020/0320396 A1* | 10/2020 | Vinyals ................. G06N 3/084 |

OTHER PUBLICATIONS

Fan, Pengfei et al. "Light Propagation Prediction through Multimode Optical Fibers with a Deep Neural Network". 2018 IIEEE 3rd Advanced Information Technology, Electronic and Automation Control Conference (IAEAC 2018), pp. 1080-1084. (Year: 2018).*

Wu, Yulin et al. "Object recognition through scattering media using convolutional neural network". 14th National Conference on Laser Technology and Optoelectronics (LTO 2019), Proc. of SPIE vol. 11170, 111700J. (Year: 2019).*

Lillicrap et al.; "Random synaptic feedback weights support error backpropagation for deep learning;" Nature Communications; Nov. 8, 2016 (10 pages).

Nøkland et al.; "Direct Feedback Alignment Provides Learning in Deep Neural Networks;" 30th Conference on Neural Information Processing System; Dec. 21, 2016 (9 pages).

Han et al.; "A 1.32 TOPS/W Energy Efficient Deep Neural Network Learning Processor with Direct Feedback Alignment based Heterogeneous Core Architecture;" Symposium on VLSI Circuits Digest of Technical Papers; 2019 (2 pages).

Han et al.; "A Low-Power Deep Neural Network Online Learning Processor for Real-Time Object Tracking Application;" IEEE Transactions on Circuits and Systems-I: Regular Papers; Nov. 30, 2018 (11 pages).

Crafton et al.; "Local Learning in RRAM Neural Networks with Sparse Direct Feedback Alignment;" Georgia Institute of Technology; Atlanta, GA; Jul. 29, 2019 (6 pages).

Charlotte Frenkel; "Bottom-Up and Top-Down Neuromorphic Processor Design: Unveiling Roads to Embedded Cognition;" UCLouvain Institute for Information and Communication Technologies, Electronics and Applied Mathematics; Jan. 2020 (171 pages).

Hughes et al.; "Training of photonic neural networks through in situ backpropagation and gradient measurement;" Optical Society of America; Jul. 19, 2018 (8 pages).

Guo et al.; "End-to-end optical backpropagation for training neural networks;" Institute of Fundamental and Frontier Sciences, University of Electronic Science and Technology of China; Dec. 23, 2019 (7 pages).

Liutkus et al.; "Imaging With Nature: Compressive Imaging Using a Multiply Scattering Medium;" Scientific Reports; Jul. 9, 2014 (17 pages).

Saade et al.; "Random Projections through multiple optical scattering: Approximating kernels at the speed of light;" IEEE International Conference on Acoustics, Speech and Signal Processing; 2016 (6 pages).

Leith et al.; "Reconstructed Wavefronts and Communication Theory;" Journal of the Optical Society of America; vol. 52; No. 10; Oct. 1962 (8 pages).

Duygu Akbulut; "Measurements of Strong Correlations in the Transport of Light through Strongly Scattering Materials;" Complex Photonic Systems Group, Department of Science and Technology and MESA+ Institute for Nanotechnology; Sep. 5, 2013 (134 pages).

Dubois et al.; "High-resolution full-field optical coherence tomography with a Linnik microscope;" Applied Optics; 2002; pp. 805-812 (8 pages).

Yamaguchi et al.; "Phase-shifting digital holography;" Optics Letters; vol. 22; No. 16; Aug. 15, 1997; pp. 1268-1270 (3 pages).

Yu et al.; "Measuring Large Optical Transmission Matrices of Disordered Media;" Physical Review Letters; Oct. 11, 2013 (5 pages).

Kim et al.; "Maximal energy transport through disordered media with the implementation of transmission eigenchannels;" Nature Photonics; Jul. 22, 2012; pp. 581-585 (5 pages).

V. Duran et al.; "Computational imaging with single-pixel detection: applications in scattering media;" Proceedings of the 13th Workshop on Information Optics (WIO'14); XP032665465; Jul. 7, 2014 (3 pages).

A. Liutkus et al.; "Imaging with Nature: A Universal Analog Compressive Imager Using a Multiply Scattering Medium;" ARXIV:1309.0425V1; XP055194020; Sep. 2, 2013 (15 pages).

D. B. Conkey et al.; "High-speed, phase-control of wavefronts with binary amplitude DMD for light control through dynamic turbid media"; Proceedings of the SPIE; vol. 8617, 86170; XP055267116; Mar. 5, 2013 (6 pages).

D. Akbulut et al.; "Focusing light through random photonic media by binary amplitude modulation;" Optics Express, vol. 19, No. 5, pp. 4017-4029; XP055267135; Feb. 15, 2011 (13 pages).

Office Action issued in U.S. Appl. No. 16/987,957; dated May 13, 2021 (19 pages).

* cited by examiner

METHOD AND SYSTEM FOR MACHINE LEARNING USING OPTICAL DATA

BACKGROUND

Machine-learning is an important technology for approximating complex solutions. For example, a model may be trained to predict real data using a training dataset over an iterative process. However, machine-learning algorithms may require extensive datasets and computing power to generate a model with sufficient accuracy.

SUMMARY

In general, in one aspect, embodiments relate to a system that includes an optical source and an adjustable spatial light modulator coupled to the optical source. The system further includes a medium coupled to the adjustable spatial light modulator. The system further includes a beam splitter coupled to the optical source and the adjustable spatial light modulator. The beam splitter generates a first optical signal and a second optical signal using the optical source. The system further includes an optical detector coupled to the beam splitter and the medium. The optical detector obtains a combined optical signal including a resulting optical signal and the second optical signal. The resulting optical signal is produced by transmitting the first optical signal through the medium at a predetermined spatial light modulation using the adjustable spatial light modulator.

In some embodiments, a system may include a controller coupled to the optical detector and the adjustable spatial light modulator. The resulting optical signal may be generated based on error data regarding an electronic model. The controller may train the electronic model using various synthetic gradients based on the combined optical signal. The adjustable spatial light modulator may be a digital micromirror device. The digital micromirror device may receive a control signal from the controller. The control signal may adjust the predetermined spatial modulation according to the error data. The electronic model may be a deep neural network including three or more hidden layers. The electronic model may be trained using a direct feedback alignment algorithm. The controller may be an application specific integrated circuit (ASIC).

In some embodiments, the medium in the system may be a diffusive physical medium. The optical source may be a laser device that generates a continuous wave (CW) signal. The predetermined spatial light modulation corresponds to a change of an amplitude at a location within a two-dimensional spatial distribution of an input optical signal. A phase modulation system may be coupled to a first beam splitter and the optical detector. The second optical signal may be a reference optical signal that is phase-shifted by the phase modulation system.

In some embodiments, the system may include an interferometer coupled to the optical source and the optical detector. The interferometer may include a first interferometer arm that transmits the first optical signal to the medium using the adjustable spatial light modulator. The interferometer may include a second interferometer arm that transmits the second optical signal to a second beam splitter. The resulting optical signal and the second optical signal may be combined in the second beam splitter to produce the combined optical signal.

In some embodiments, the optical detector may be a camera device including various complementary metal-oxide semiconductor (CMOS) sensors. The optical detector may generate an optical image using the combined optical signal.

In general, in one aspect, embodiments relate to a method that includes determining, using a computer processor, error data of an electronic model using training data and predicted data that is generated by the electronic model. The method further includes obtaining, by the computer processor and from an optical detector, optical data regarding a combined optical signal including a reference optical signal and a resulting optical signal. The resulting optical signal is produced by transmitting an optical signal through a medium at a predetermined light modulation based on the error data. The method further includes determining, using the computer processor, various synthetic gradients based on the optical data, the electronic model, and the training data. The method further includes updating, using the computer processor, the electronic model using the synthetic gradients.

In some embodiments, the method may include transmitting a control signal to the adjustable spatial light modulator in an optical system. The adjustable spatial light modulator may include a digital mirror device, and the control signal may cause the adjustable spatial light modulator to change an input optical signal to have the predetermined light modulation.

In some embodiments, the method may include obtaining, from the optical detector, output optical data regarding a second combined optical signal including a second resulting signal and a second reference optical signal. The method may include determining, using Fourier transform processing, a speckle field from the output optical data. The speckle field corresponds to a transmission matrix of the medium that produces the second resulting signal.

In some embodiments, the method may obtaining, from the optical detector, output optical data regarding a second combined optical signal including a second resulting signal and a second reference optical signal. The method may determine, using combined field quadrature processing, a speckle field from the output optical data. An amount of phase-shift of the second reference optical signal may be adjusted to determine the speckle field.

In some embodiments, the method may transmitting a control signal to a phase modulation system coupled to a beam splitter to generate two or more optical images. The beam splitter may generate a first optical signal and a second optical signal. The first optical signal is transmitted through the medium to produce the resulting signal. The second optical signal may be phase-shifted by the phase modulation system to produce the reference optical signal. The control signal causes the phase modulation system to adjust a predetermined amount of phase-shifting within the reference optical signal.

In some embodiments, the method may include determining whether the electronic model satisfies a predetermined criterion based on second error data. The method may include determining, in response to the electronic model failing to satisfying the predetermined criterion, various synthetic gradients for updating the electronic model. The electronic model is updated until the second error data converges to the predetermined criterion.

In some embodiments, the electronic model may be a deep neural network including three or more hidden layers. The synthetic gradients may be determined using a direct feedback alignment algorithm. The computer processor may be an application specific integrated circuit (ASIC). The first error data may be an error vector that is generated using a cross-entropy function.

In some embodiments, the method may include determining an advertisement recommendation using user data and a trained model that is generated from the electronic model using the synthetic gradients.

In general, in one aspect, embodiments relate to a non-transitory computer readable medium storing instructions executable by a computer processor. The instructions determine error data of an electronic model using training data and predicted data that is generated by the electronic model. The instructions further obtain, from an optical detector, optical data regarding a combined optical signal including a reference optical signal and a resulting optical signal. The resulting optical signal is produced by transmitting an optical signal through a medium at a predetermined light modulation based on the error data. The instructions determine various synthetic gradients based on the optical data, the electronic model, and the training data. The instructions update the electronic model using the synthetic gradients.

Other aspects of the disclosure will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

Specific embodiments of the disclosure will now be described in detail with reference to the accompanying figures. Like elements in the various figures are denoted by like reference numerals for consistency.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for using machine-learning algorithms and optical data to generate an electronic model. In particular, some embodiments are directed toward using an optical system in order to determine synthetic gradients for an electronic model update. In some embodiments, the medium may be a diffusive medium or an engineered medium. For example, where an electronic model fails to accurately predict a real-world application, error data based on the difference between predicted data and real-world data may form the basis of an input vector to an optical system coupled to a medium. Where a computer may individually determine updated weights within a machine-learning model, a speckle field value of a medium may provide a relatively fast process for determining synthetic gradients for multiple hidden layers within a deep neural network. In other words, an optical system may provide a portion of the processing to determine synthetic gradients within a machine-learning algorithm, while a controller may perform the remaining portion of the synthetic gradient generation, e.g., using Fourier transforms and other techniques to determine the complex-valued speckle field. In some embodiments, for example, the machine-learning algorithm is a direct feedback alignment algorithm.

In some embodiments, the speckle field is determined by an optical image that is obtained by an optical detector in an optical system responsible for a portion of the synthetic gradient computation. For example, an optical image may record a combined optical signal obtained by mixing a reference optical signal and a resulting optical signal output from a medium. More specifically, a linear mixing of real and imaginary components of an optical signal may occur during transmission through a medium. As such, the optical image may provide a matrix multiplication sufficient for generating synthetic gradients for various hidden layers within an electronic model after further processing of the optical data by a controller. For example, the matrix multiplication may be a multiplication by a fixed random matrix or by an arbitrary matrix where an engineered medium is used.

Figure 1:
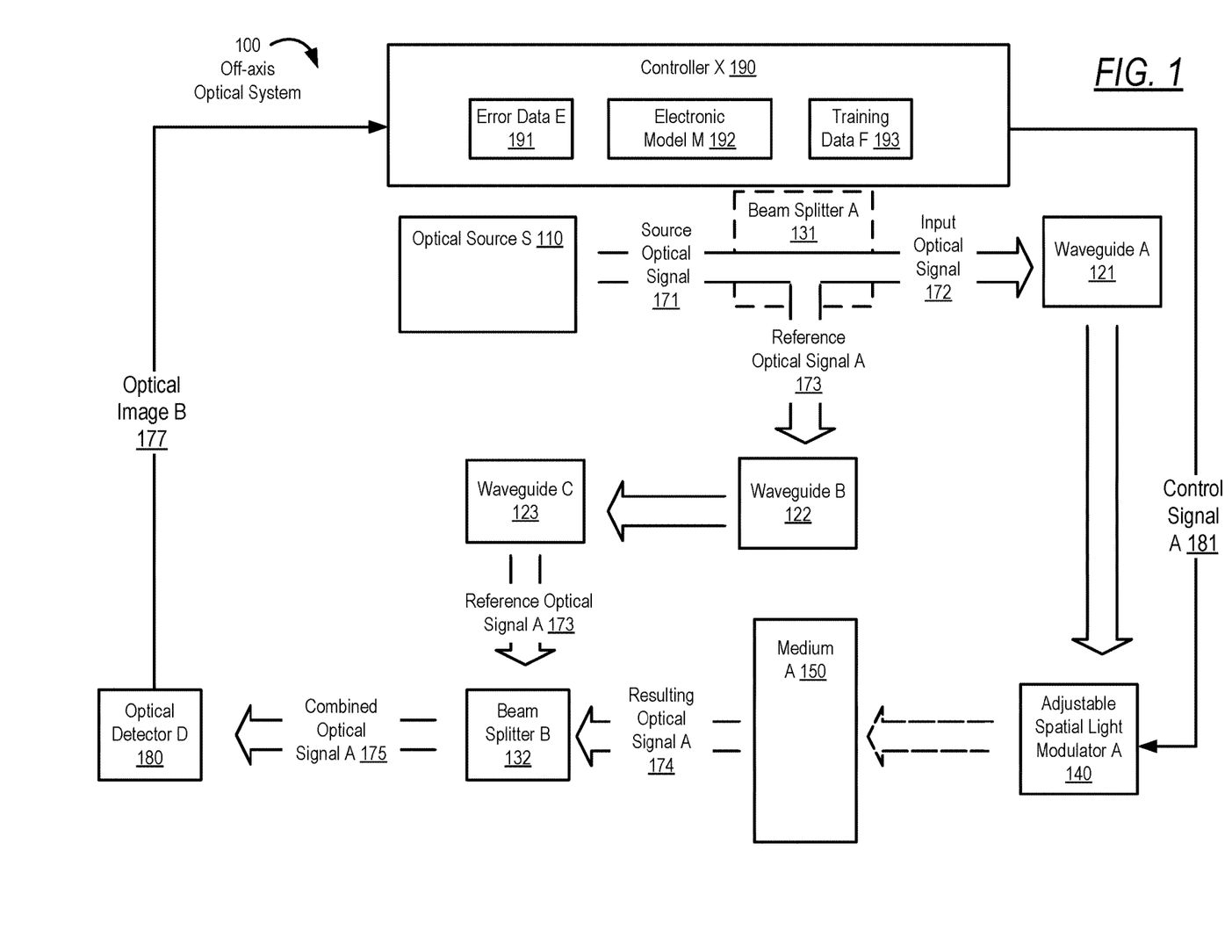
FIGS. 1, 2, and 3 show systems in accordance with one or more embodiments.

Turning to FIG. 1, FIG. 1 shows a schematic diagram in accordance with one or more embodiments. As shown in FIG. 1, FIG. 1 illustrates an off-axis optical system (100) that may include an optical source (e.g., optical source S (110)) coupled to an adjustable spatial light modulator (e.g., adjustable spatial light modulator A (140)), an optical detector (e.g., optical detector D (180)), and various beam splitters (e.g., beam splitter A (131), beam splitter B (132)). For example, the optical source may be a coherent light source such as a laser device. More specifically, the optical source may include hardware with functionality for generating a continuous wave (CW) signal, e.g., an optical signal that is not pulsed. In some embodiments, the adjustable spatial light modulator is a digital micromirror device (DMD). Furthermore, other technologies like liquid crystal on silicon (LCoS) or electro-absorption modulators are also contemplated for the adjustable spatial light modulator. In some embodiments, a single frequency optical source is used, but other embodiments are contemplated that use multiple optical wavelengths.

The optical detector may be a camera device that includes hardware and/or software to record an optical signal at one or more optical wavelengths. For example, the optical detector may include an array of complementary metal-oxide-semiconductor (CMOS) sensors. Thus, the optical detector may include hardware with functionality for recording the intensity of an optical signal. The beam splitters may include hardware with functionality for splitting an incident optical signal into two separate output optical signals (e.g., beam splitter A (131) divides optical source signal (171) into an input optical signal (172) and a reference optical signal A (173)). A beam splitter may also include functionality for combining two separate input optical signals into a single combined optical signal (e.g., combined optical signal A (175)). In some embodiments, a beam splitter may be a polarizing beam splitter that separates an unpolarized optical signal into two polarized signals. Thus, the system may include a polarizer coupled to the optical detector.

In some embodiments, an off-axis optical system includes functionality for generating a reference optical signal (e.g., reference optical signal A (173)) (also called "reference beam") and an input optical signal (e.g., input optical signal (172)) (also called "signal beam") using a source optical signal (e.g., source optical signal (171)). As shown in FIG. 1, for example, the input optical signal (172) is transmitted through a medium A (150) at a particular light modulation to produce a resulting optical signal A (174). At beam splitter B (132), the reference optical signal A (173) is combined with the resulting optical signal A (174) to generate a combined optical signal A (175). As such, the optical detector D (180) receives the combined optical signal A (175) for further processing, e.g., to generate an optical image B (177) that is analyzed to determine a speckle field of the medium A (150). Accordingly, the off-axis optical system (100) provides an optical system for determining synthetic gradients for updating an electronic model (e.g., electronic model M (192)) during a machine learning algorithm.

In some embodiments, a medium may be a disordered or random physical medium that is used for computing values in a random matrix. Examples of a medium include translucent materials, amorphous materials such as paint pigments, amorphous layers deposited on glass, scattering impurities embedded in transparent matrices, nano-patterned materials and polymers. An example of such a medium is a layer of an amorphous material such as a layer of Zinc-oxide (ZnO) on a substrate. In some embodiments, a medium may be engineered to implement a specific transform of the light field. Examples of an engineered medium may include phase masks manufactured using a lithography technique. More specifically, the engineered medium may be an electronic device that includes various electrical properties detectable by optical waves. Example of such electronic devices may include LCoS spatial light modulators. In some embodiments, multiple media may be combined together to implement a series of transformations of the light field.

In some embodiments, an adjustable spatial light modulator includes functionality for transmitting an input optical signal through a medium (e.g., medium A (150)) at a predetermined light modulation. More specifically, the adjustable spatial light modular may include hardware/software with functionality to spatially modulate an input optical signal in two-dimensions based on input information. For example, according to the input information, the adjustable spatial light modulator may change the spatial distribution of the input optical signal in regard to phase, polarization state, intensity amplitude, and/or propagation direction. In some embodiments, an adjustable spatial light modulator performs binary adjustments, such that a portion of the input optical signal at a particular location is transmitted to the medium either with a light modulation change or without such a change. In some embodiments, an adjustable spatial light modulator modifies a portion of an input optical signal with a range of values, e.g., various grey levels of light modulation.

Figure 4:
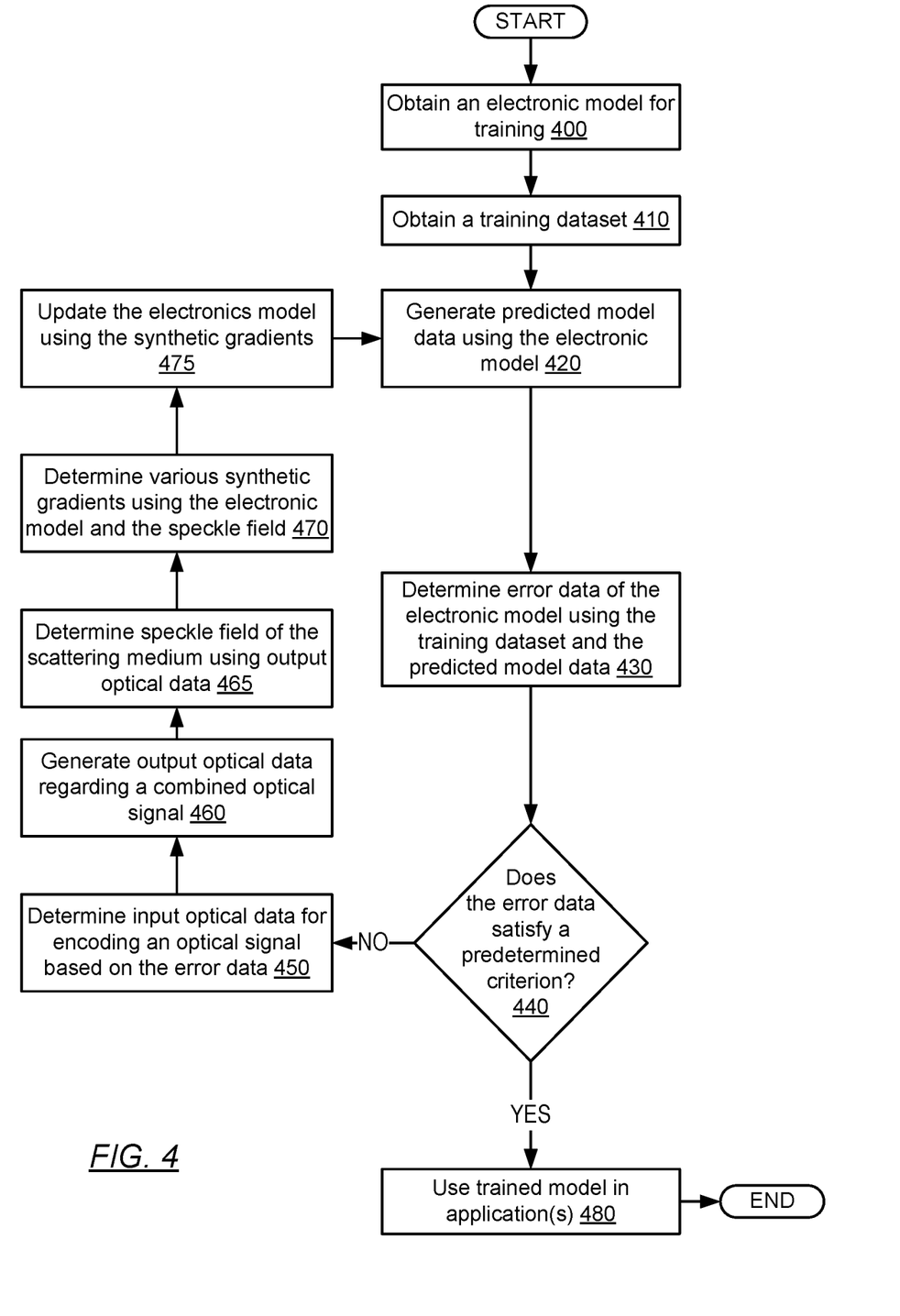
FIG. 4 shows a flowchart in accordance with one or more embodiments.

Furthermore, the output of an adjustable spatial light modulator may be transmitted through a medium with a predetermined light modulation as specified by an input vector (e.g., a control signal A (181) based on error data E (191)). When the input optical signal is transmitted through the medium (e.g., medium A (150)), the input optical signal may undergo various optical interferences, which may be analyzed in a resulting optical signal output from the medium. In some embodiments, the propagation of coherent light through a medium may be modeled by the following equation:

$$y=Hx \qquad \text{Equation 1}$$

where H is a transmission matrix of the medium, x is an input optical signal, and y is the resulting optical signal. Moreover, the transmission matrix H may include complex values with real components and imaginary components. For a diffusive medium, these components may be arranged according to a Gaussian distribution. More specifically, a speckle field of the medium may interfere with an input optical signal such that an optical detector records an image illustrating a modulated speckle pattern. Thus, the image may be processed to extract values of a speckle field. For more information on processing an optical image, see Blocks 460 and 465 in FIG. 4 below and the accompanying description.

In some embodiments, a controller (e.g., controller X (190)) is coupled to an optical detector and an adjustable spatial light modulator. In particular, a controller may include hardware and/or software to acquire output optical data from an optical detector to train an electronic model (e.g., electronic model M (192)). More specifically, the electronic model may be a machine-learning model that is trained using various synthetic gradients based on output optical data (e.g., optical image B (177)), error data (e.g., error data E (191)) and a machine-learning algorithm. The controller X (190) may determine error data E (191) that describes the difference between training data F (193) and predicted model data that is generated by the electronic model M (192). Likewise, an electronic model may predict data for many types of artificial intelligence applications, such as reservoir modeling, automated motor vehicles, medical diagnostics, etc. Furthermore, the electronic model may be using training data as an input for the machine learning algorithm. Training data may include real data acquired for an artificial intelligence application, as well as augmented data and/or artificially-generated data.

In some embodiments, the electronic model is a deep neural network and the machine-learning algorithm is a direct feedback alignment algorithm. For more information on machine-learning models, see FIGS. 3 and 4 below and the accompanying description. Examples of controllers may include an application specific integrated circuit (ASIC), a field programmable gate array (FPGA), a printed circuit board, or a personal computer capable of running an operating system. Likewise, the controller may be a computing system similar to computing system (600) described below in FIG. 6 and the accompanying description.

Keeping with the controller, the controller may include functionality for transmitting one or more control signals to manage one or more components within an off-axis optical system (e.g., optical source S (110), adjustable spatial light modulator A (140)). In some embodiments, for example, a controller may use a control signal (e.g., control signal A (181)) to determine a light modulation of an input optical signal (172) is transmitted through a medium. For a binary control signal, a high voltage value may trigger one light modulation value of an input optical signal, while a low voltage value may trigger a different light modulation angle. Thus, by using a control signal to manage the light modulation, a controller may implement an input vector to produce different types of optical images for use in updating an electronic model. For example, an optical detector may acquire an image frame that corresponds to an optical treatment of the input vector by an optical system. The image frame may then be post-processed to extract a linear matrix multiplication of the input vector. Multiple image frames and optical signal passes for a single input vector may be used by an off-axis optical system to determine the linear random projection and thus generate synthetic gradients.

In some embodiments, an off-axis optical system may include one or more waveguides (e.g., waveguide A (121), waveguide B (122), waveguide C (123)) to manage the transmission of optical signals (e.g., reference optical signal A (173), input optical signal (172)). For example, the waveguides (122, 123) may direct the reference optical signal A (173) through the off-axis optical system (100) to the beam splitter B (132). Waveguides may include various optical structures that guide electromagnetic waves in the optical spectrum to different locations within an optical system, such as a photonic integrated circuit. For example, optical waveguides may include optical fibers, dielectric waveguides, spatial light modulators, micromirrors, interferometer arms, etc. In some embodiments, an off-axis optical system uses free-space in place of one or more waveguide components. For example, a reference optical signal A (173) may be transmitted from beam splitter A (131) to beam splitter B (132) through air.

In some embodiments, the off-axis optical system (100) includes an interferometer. For example, waveguide A (121) may be an interferometer arm that transmits the input optical signal (172) and the subsequent resulting optical signal A (174) to beam splitter B (132). As such, the medium may be disposed inside this interferometer arm. Likewise, the waveguides (122, 123) may be another interferometer arm for transmitting the reference optical signal A (173) from beam splitter A (131) to beam splitter B (132). Where the off-axis optical system is implemented with interferometry, the overall optical system may be sufficiently stable and configured with optical signals having a wavelength of 532 nm.

Figure 2:
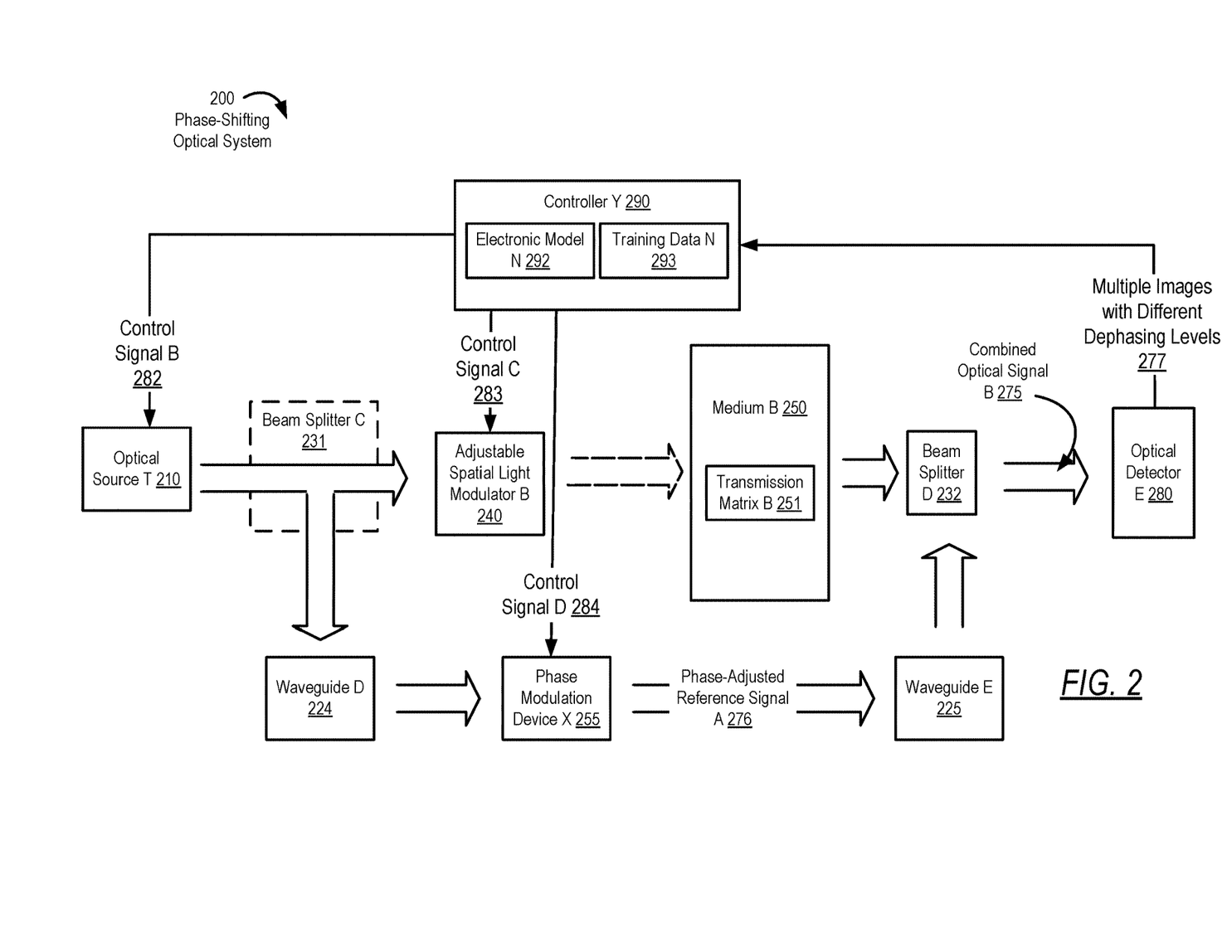

Turning to FIG. 2, FIG. 2 shows a schematic diagram in accordance with one or more embodiments. As shown in FIG. 2, FIG. 2 illustrates a phase-shifting optical system (200) that may include an optical source (e.g., optical source T (210)), an adjustable spatial light modulator (e.g., adjustable spatial light modulator B (240)), an optical detector (e.g., optical detector E (280)), various beam splitters (e.g., beam splitter C (231), beam splitter D (232)), various waveguides (e.g., waveguide D (224), waveguide E (225)), a medium (e.g., medium B (250) with a transmission matrix B (251)), and a controller (e.g., controller Y (290)). A controller may transmit various control signals to various components (e.g., control signal B (282), control signal C (283), control signal D (284)) in order to manage one or more parameters of the phase-shifting optical system for generating synthetic gradients. Similar to the off-axis optical system (100) in FIG. 1, a phase-shifting optical system may generate a combined optical signal (e.g., combined optical signal B (275)) based on a reference signal (e.g., phase-adjusted reference signal A (276)) and a resulting optical signal output from a medium (e.g., medium B (250)). Furthermore, an optical detector may produce output optical data (e.g., multiple images with different dephasing levels (277)) to train an electronic model (e.g., electronic model N (292)) using training data (e.g., training data N (293)). More specifically, one or more components or technologies implemented using a phase-shifting optical system may be similar components and/or technologies described above with respect the off-axis optical system in FIG. 1 and the accompanying description.

In some embodiments, a phase-shifting optical system includes a phase modulation device (e.g., phase modulation device X (255)). In particular, a phase modulation device may include hardware/software with functionality for phase-shifting an optical signal by a predetermined amount. Example phase-modulation devices may include a liquid crystal device, an electro-optical modulator, or a device using various piezo-crystals to implement phase-shifting. As shown in FIG. 2, a phase modulation device may receive a control signal (e.g., control signal D (284)) from a controller to produce various phase-adjusted reference signals (e.g., phase-adjusted reference signal A (276)).

In some embodiments, a medium's full field is obtained from multiple images with different dephasing levels of a reference optical signal. In particular, optical data post-processing may include a simple linear combination from multiple images. For example, two images with different dephasing level may be used by a controller to determine an imaginary component of a combined optical signal. To determine both the imaginary component and the real component of a combined optical signal, three images with different dephasing may be used.

The systems described in FIG. 1 and FIG. 2 may leverage a medium's transmission matrix to perform a large matrix multiplication required by an electronic model. In some embodiments, the electronic model may be a machine-learning algorithm. The machine-learning algorithm may have applications in reservoir computing, random kernel processing, extreme machine learning, differential privacy, etc. A system with a disordered medium may be used to perform random projections. For example, in a reservoir computing algorithm the medium transmission matrix may act as the reservoir. The reservoir computing algorithm may be used to predict the behavior of a chaotic physical system, such as predicting future weather patterns. Or, in an algorithm that processes data with a kernel, the kernel may be approximated using random features produced by the system. For example, the kernel may be used in a diffusion map, to generate a representation of the dynamics of a drug molecule. Likewise, in an algorithm implementing differential privacy, an embedding of a sensitive data sample may be generated using the system to ensure the data sample remains private. The differential privacy algorithm may be used to process sensitive data such as health data, geolocation data, etc. In some embodiments, the electronic model may be used to process a database including high-dimensional data. The system may be used to generate hashes of the item in the database, to help access and process them faster. For example, an algorithm may be a locally sensitive hashing algorithm, using the system to perform random projections that preserve the distance between entries in the database. In some embodiments, the electronic model may process continuous streams of data, and implement an online learning algorithm. For example, the system may be used to generate a sketch of an acquired data sample and the algorithm may use the sketch to perform change-point detection. The change-point detection algorithm may be used to detect anomalies in streams of financial transactions, streams of industrial sensors, remote sensing images, etc. In some embodiments, the electronic model may be a randomized linear algebra algorithm. For example, the system may be used to randomly precondition matrices before applying a singular value decomposition algorithm. The singular value decomposition obtained after preconditioning may be used in a recommender system, for example to suggest an ad to display, or content to watch.

Figure 3:
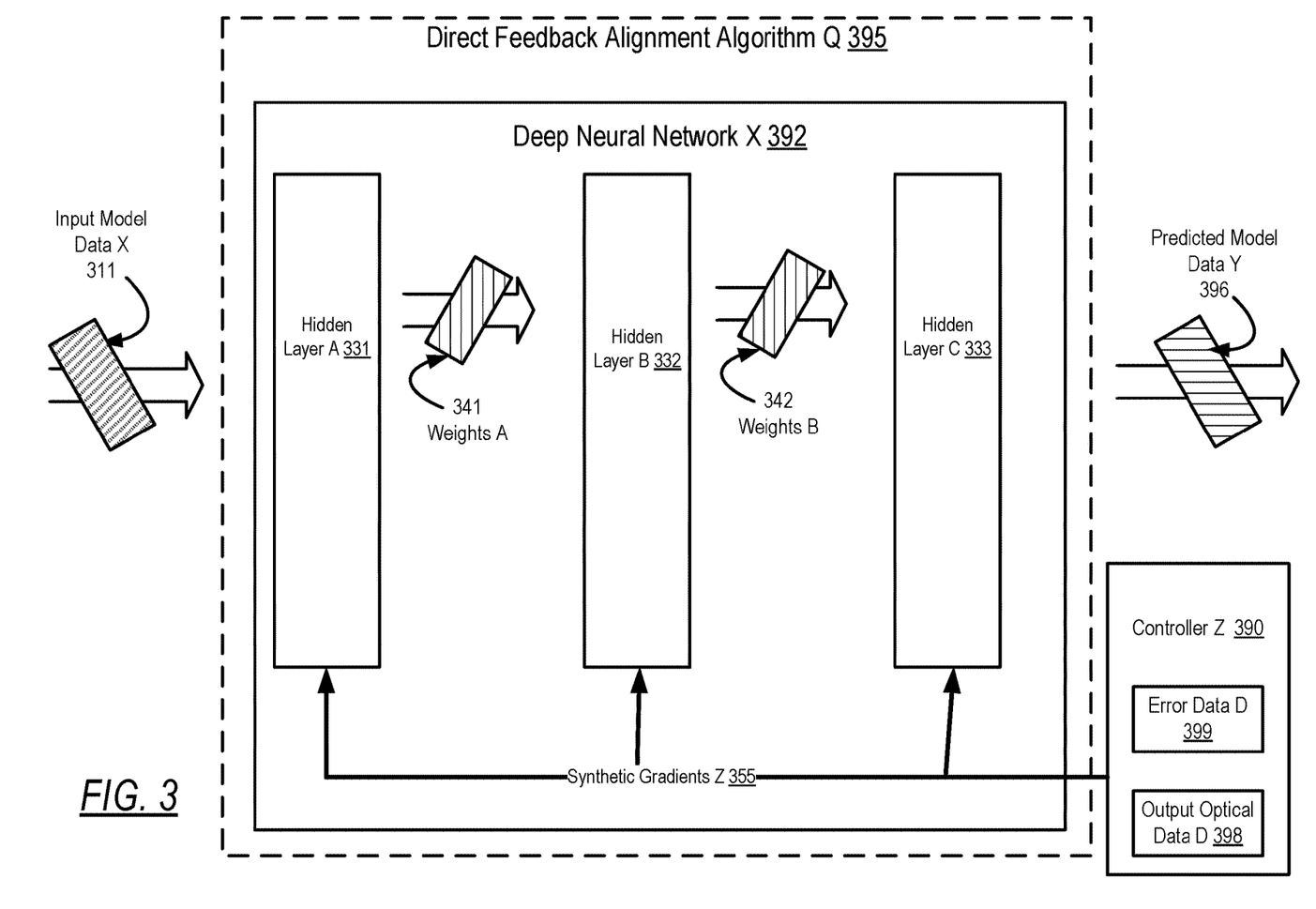

Turning to FIG. 3, FIG. 3 illustrates an electronic model in accordance with one or more embodiments. As shown in FIG. 3, FIG. 3 illustrates an electronic model (e.g., deep neural network X (392)) that is trained using a machine-learning algorithm (e.g., direct feedback alignment algorithm Q (395)) and various inputs (e.g., input model data X (311)). For example, the electronic model may be a deep neural network that includes three or more hidden layers, where a hidden layer includes at least one neuron. A neuron may be a modelling node that is loosely patterned on a neuron of the human brain. As such, a neuron may combine data inputs with a set of coefficients, i.e., a set of weights (e.g., weights A (341), weights B (342)) for adjusting the data inputs transmitted through the model. These weights may amplify or reduce the value of a particular data input, thereby assigning an amount of significance to data inputs passing between hidden layers. Through machine learning, a neural network may determine which data inputs should receive greater priority in determining a specified output of the neural network. Likewise, these weighted data inputs may be summed such that this sum is communicated through a neuron's activation function (e.g., a sigmoid function) to other hidden layers within the neural network. As such, the activation function may determine whether and to what extent an output of a neuron progresses to other neurons in the model. Likewise, the output of a neuron may be weighted again for use as an input to the next hidden layer.

Furthermore, an electronic model may be trained using various machine-learning algorithms. For example, various types of machine-learning algorithms may be used to train the model, such as a backpropagation algorithm. In a backpropagation algorithm, gradients are computed for each hidden layer of a neural network in reverse from the layer closest to the output layer proceeding to the layer closest to the input layer. As such, a gradient may be calculated using the transpose of the weights of a respective hidden layer based on an error function (e.g., computing the difference between predicted model data Y (396) from the deep neural network X (392) and training data). The error function may be based on various criteria, such as mean squared error function, a similarity function, etc., where the error function may be used as a feedback mechanism for tuning weights in the electronic model.

In some embodiments, the weights of an electronic model are binary weights. For example, binarization may be performed using a deterministic approach or a stochastic approach. In the deterministic approach, parameters within a model may be binarized using a sign function, where values equal or greater than an entry position are designated one value, e.g., '+1', and all other values are designated a different value, e.g., '−1'. In a stochastic approach, weights may be binarized using a sigmoid function. In some embodiments, weights in an electronic model are ternarized weights. For example, ternarized weights may include the values '+1', '0', and '−1', and where data is ternarized using a threshold function. For example, a threshold function may have a tunable threshold value, where data above the positive threshold value is '+1', data below the negative threshold value is '−1', and data with an absolute value between the positive and negative threshold values is '0'. A real valued copy of a model's weights may be stored by a controller, where the binary weights are updated during a training iteration and the updated weights are binarized again.

As shown in FIG. 3, for example, a deep neural network X (392) generates predicted model data Y (396) in response to input model data X (311). Thus, a controller Z (390) may determine error data D (399) using an error function that computes the difference between the predicted model data Y (396) and training data for a particular application. In some embodiments, this error function may be a root mean square function, or a cross-entropy function. In other embodiments, the error function may compare data obtained at intermediary steps in the neural network and the training data. Or, the error function may also only use the mathematical properties of the predicted model data. Using the error data D (399), the controller Z (390) may obtain output optical data D (398) from an optical detector in an off-axis optical system or a phase-shifting optical system. Using the output optical data D (398), the controller Z (390) may determine a speckle field accordingly in which to calculate the synthetic gradients Z (355). Thus, output optical data D (398) may be obtained for multiple error values for various training iterations, which may be referred to as machine-learning batches. An ensemble of such training iterations covering the entire training data may be referred to as machine-learning epochs. In each training iteration, different error values may correspond to different values of synthetic gradients.

In some embodiments, an electronic model is trained using a direct feedback alignment algorithm (e.g., direct feedback alignment algorithm Q (395)). Similar to a backpropagation algorithm, error data is determined in a direct feedback alignment algorithm between training data and predicted data from a model. However, an error vector may be determined for updating weight values for multiple hidden layers concurrently. Thus, in some embodiments, a direct feedback alignment algorithm determines synthetic gradients (e.g., synthetic gradients Z (355)) by projecting the error vector to the dimensions of the hidden layers using matrices. For example, a matrix for a synthetic gradient may have the same dimensions as the transpose of a weight matrix in a backward propagation algorithm. As such, synthetic gradients may drive the learning process for the various hidden layers. Using this prediction, the electronic model may be updated using synthetic gradients in contrast to an ordinary gradient update mechanism implemented with a backpropagation algorithm.

While FIGS. 1, 2, and 3 show various configurations of components, other configurations may be used without departing from the scope of the disclosure. For example, various components in FIGS. 1, 2, and 3 may be combined to create a single component. As another example, the functionality performed by a single component may be performed by two or more components.

Turning to FIG. 4, FIG. 4 shows a flowchart in accordance with one or more embodiments. Specifically, FIG. 4 describes a method for training an electronic model and/or using a trained model. One or more blocks in FIG. 4 may be performed by one or more components (e.g., controller X (190)) as described in FIGS. 1, 2, and/or 3. While the various blocks in FIG. 4 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 400, an electronic model is obtained for training in accordance with one or more embodiments. For example, the electronic model may be a machine-learning model that is capable of approximating solutions of complex non-linear problems, such as a deep neural network X (392) described above in FIG. 3 and the accompanying description. Likewise, the electronic model may be initialized with weights and/or biases prior to training.

In Block 410, a training dataset is obtained in accordance with one or more embodiments. For example, a training dataset may be divided into multiple batches for multiple epochs. Thus, an electronic model may be trained iteratively using epochs until the electronic model achieves a predetermined level of accuracy in predicting data for a desired application. One iteration of the electronic model may correspond to Blocks 420-475 below in FIG. 4 and the accompanying description. Better training of the electronic model may lead to better predictions using the model. Once the training data is passed through all of the epochs and the model is further updated based on the model's predictions in each epoch, a trained model may be the final result of a machine-learning algorithm, e.g., in Block 480 below. In some embodiments, multiple trained models are compared and the best trained model is selected accordingly. In other embodiments, the predictions of multiple trained models may be combined using an ensembling function to create a better prediction. This ensembling function may be tuned during the training process. In some embodiments, the multiple considered models may all be trained in parallel using a single optical system. Likewise, different portions of the training data may be used as batches to train the model and determine error data regarding the model.

In Block 420, predicted model data is generated using an electronic model in accordance with one or more embodiments. In particular, based a set of input model data, an electronic model may generate predicted output model data for comparison with real output data. For a medical diagnostic example, a patient's data may include various patient factors, such as age, gender, ethnicity, and behavioral considerations in addition to various diagnostic data, such as results of blood tests, magnetic-resonance imaging (MRI) scans, glucose levels, etc. that may serve as inputs to an electronic model. For a predicting a specific medical condition such as a cancer diagnosis, one or more of these inputs may be used by the electronic model with machine learning to predict whether the patient has a particular medical condition. Here, a prediction regarding a patient's medical condition, i.e., predicted model data, may be compared to whether the actual patients was confirmed to have the particular medical condition, i.e., acquired data for verifying the electronic model's accuracy.

In Block 430, error data of an electronic model is determined using a training dataset and predicted model data in accordance with one or more embodiments. Based on the difference between predicted model data and training data, weights and biases within the electronic model may need to be updated accordingly. More specifically, the error data may be determined using an error function similar to the error function described above in FIG. 3 and the accompanying description. Likewise, where the error data identifies the electronic model as lacking a desired level of accuracy, the error data may be used by an optical system (e.g., off-axis optical system (100) or phase-shifting optical system) to compute synthetic gradients for updating the electronic model.

In Block 440, a determination is made whether the error data satisfies a predetermined criterion in accordance with one or more embodiments. For example, the criterion may be a predetermined threshold based on the difference between real acquired data and the predicted model data. Likewise, a controller may determine whether the difference has converged to a minimum value, i.e., a predetermined criterion. When a determination is made that no further machine-learning epochs are required for training the electronic model, the process may proceed to Block 480. When a determination is made that the electronic model should be updated, the process may return to Block 450.

In Block 450, input optical data is determined for encoding an optical signal based on error data in accordance with one or more embodiments. Using error data regarding an electronic model, input optical data may be determined that corresponds to a control signal for an adjustable spatial light modulator. For example, the input optical data may specify a particular light modulation with respect to a current error value between predicted model data and acquired real data.

In Block 460, output optical data regarding a combined optical signal is generated in accordance with one or more embodiments. For example, the output optical data may be similar to optical image B (177) acquired from the off-axis optical system (100) in FIG. 1 or multiple images with different dephasing levels (277) acquired from the phase-shifting optical system (200) in FIG. 2. Likewise, the combined optical signal may be similar to combined optical signal A (175) or combined optical signal B (275) described above in FIGS. 1 and 2, respectively, and the accompanying description.

In Block 465, output optical data is processed to determine a speckle field of a medium in accordance with one or more embodiments. In particular, a controller may determine a linear random projection of an input optical signal using such processing techniques. For example, a resulting optical signal at a predetermined light modulation may result in a fringed speckle pattern when transmitted through a medium. Thus, an optical image with the fringed speckle pattern may be processed to determine a speckle field and/or the full field of an optical signal.

In some embodiments, a speckle field is determined using Fourier transform processing. More specifically, a combined optical signal generated by an off-axis optical system or a phase-shifting optical system may be the sum of a resulting optical signal and a reference optical signal. Thus, if the intensities of both optical signals were recorded individually and then processed numerically, the summation may approximate the intensity of the combined optical signal. As such, a linear phase shift in the spatial domain may correspond to a translation in the Fourier space. In other words, a Fourier transform may enable a separation of a speckle field from the combined optical signal. In particular, by tuning the incident angle on the camera between the resulting optical signal and the reference optical signal, the speckle field may be isolated from other components within a combined optical signal. This tuning may be performed only once, when the system is first calibrated.

To recover a phase value of each pixel of an optical image, the linear component of the Fourier transform may be isolated in the Fourier space. As such, an inverse Fourier transform to complete the phase retrieval post-processing may be performed in some embodiments. In another embodiment, an inverse Fourier transform is not performed as the Fourier transform may produce a linear random projection from an optical image that is sufficient to determine synthetic gradients for updating an electronic model at Block 475 below.

Figure 5A:
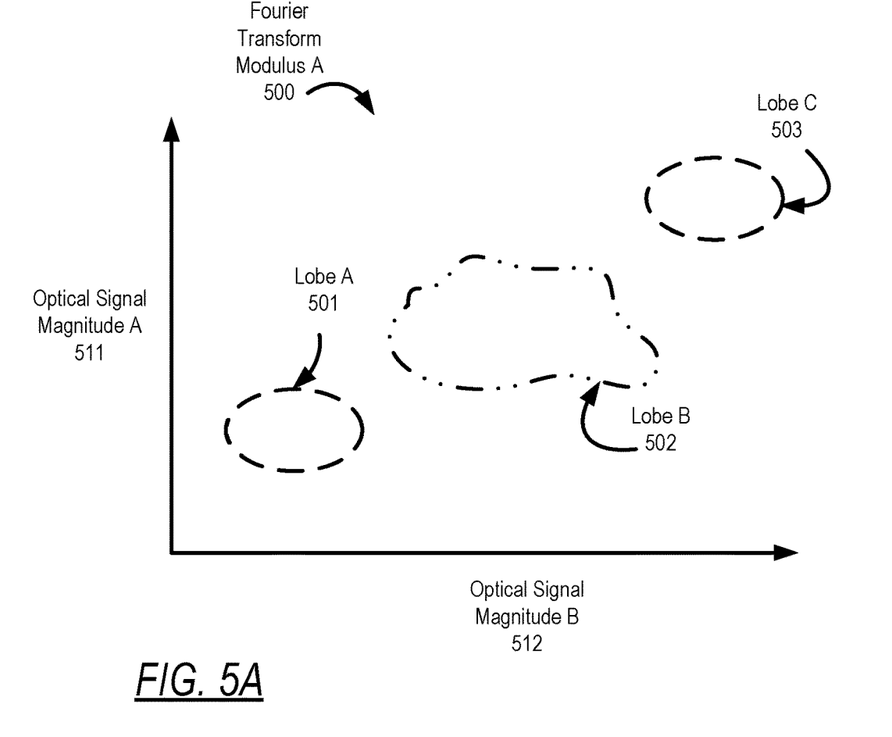
FIGS. 5A and 5B show an example in accordance with one or more embodiments.
Figure 5B:
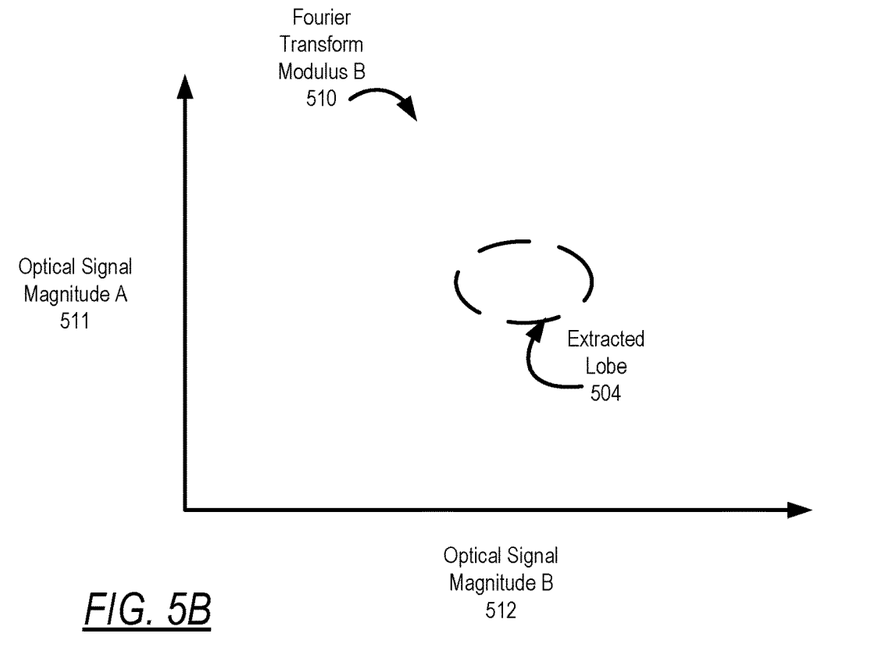

Turning to FIGS. 5A and 5B, FIGS. 5A and 5B provide an example of

Fourier transform processing using an adjustable spatial light modulator. The following example is for explanatory purposes only and not intended to limit the scope of the disclosed technology.

In FIG. 5A, a Fourier Transform Modulus A (500) is generated based on a measured intensity of an optical signal by an optical detector. In particular, the optical signal's intensity is recorded in an optical image with vertical and horizontal axes. The magnitude of the Fourier transform of the recorded optical signal in the vertical axis is the optical signal magnitude A (511). Likewise, the magnitude of the Fourier transform of the recorded optical signal in the horizontal axis is the optical signal magnitude B (512). As shown in FIG. 5A, three components of the Fourier transform of the recorded optical signal are illustrated, i.e., lobe A (501), lobe B (502), and lobe C (503). In this example, lobe B (502) corresponds to an incoherent sum of a resulting optical signal and a reference optical signal. Likewise, lobe A (501) and lobe C (503) correspond to phase and amplitude information of a speckle field produced by a medium. Lobe A (501), lobe B (502), lobe C (503) are separated by using a quantitative value determined for a tilt of a reference optical signal. In FIG. 5B, an extracted lobe (504) is obtained by isolating either lobe A (501) or lobe C (503) to produce a lobe proportional to a speckle field of a medium. As lobe A (501) and lobe C (503) are symmetric in the Fourier field and thus include the same information, they may be used interchangeably. Accordingly, an inverse Fourier transform on the Fourier Transform Modulus B (510) retrieves the speckle field. If a different input optical signal is used, some further calculations may be performed to determine the speckle field from the optical image.

Returning to Block 465, in some embodiments, a speckle field for a medium is determined using combining fields quadratures processing. Where Fourier transforms may be inefficient for complex optical computations, combining fields quadratures processing may provide simpler calculations for a controller to determine a speckle field. In particular, a tilt of an optical signal may be adapted, such that the phase of the optical signal varies by a predetermine phase (e.g., $\pi/2$) from one pixel to the following pixel within an optical image. Accordingly, by tuning a reference optical signal's phase shift, the speckle field may be calculated accordingly using only linear combinations.

In some embodiments, a speckle field for a medium is determined using a subtraction technique based on a high intensity reference path. For example, an intensity of an input optical signal may be separately acquired. By setting the intensity of an input optical signal to be much greater than the speckle field component, the input optical signal's intensity may be subtracted from the recorded optical image. The subtracted value may then be used to determine the speckle field.

In Block 470, various synthetic gradients are determined using an electronic model and a speckle field in accordance with one or more embodiments. Synthetics gradients may be generated in a similar manner as the synthetic gradients described above in FIG. 3 and the accompanying description.

In Block 475, an electronic model is updated using various synthetic gradients in accordance with one or more embodiments. In particular, the synthetic gradients may adjust various weights through the electronic model for another error function calculation to verify the accuracy of the electronic model.

In Block 480, a trained model is used in one or more applications in accordance with one or more embodiments. For example, trained models may be used to predict data in image recognition tasks, natural language processing workflows, recommender systems, graph processing, etc.

In some embodiments, for example, the process described in FIG. 4 may be integrated into a simulator for analyzing very large datasets, such as a seismic survey of a subterranean formation. Likewise, a controller coupled to an optical system described above in FIGS. 1-4 may be integrated into a motor vehicle, an aircraft, a cloud server, and many other devices that may require fast processing of a very large dataset to update and/or generate a machine-learning model. In some embodiments, the process may be integrated in a computer vision workflow, such as a facial recognition system, or a self-driving vehicle vision system. Similarly, the process may be used to update a natural language processing model. The model may rely on an attention mechanism, arranged in transformer layers. For example, the model may be used to translate text from a language to another, to embed natural language instructions in a machine-understandable format, or to generate text from a user-defined prompt. These applications may be combined together in the setting of a smart assistant, or of an automated support system. Likewise, the process may be used to update a graph-processing model. The graph processing-model may generate molecular fingerprints to represent complex chemical structures such as drugs, to analyze communities and process social interactions, to iteratively learn combinatorial problems, or to analyze intricate organized structures such as DNA. In some embodiments, the process may be used to update in real-time recommender systems, such as an ad serving system.

Figure 6:
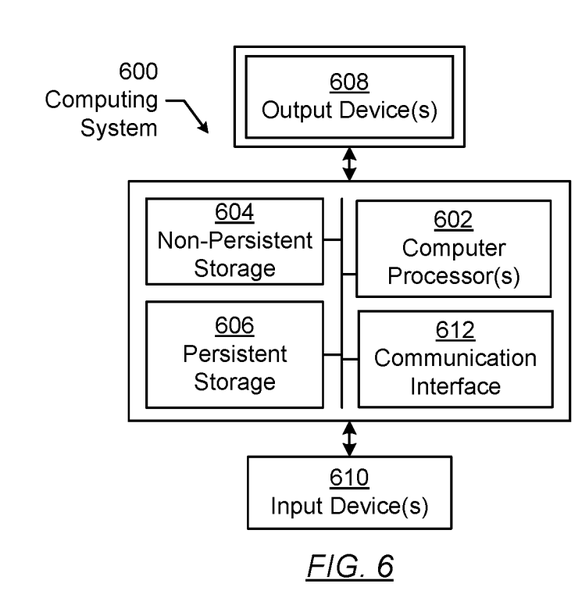
FIG. 6 shows a computing system in accordance with one or more embodiments.

Embodiments may be implemented on a computing system. Any combination of mobile, desktop, server, router, switch, embedded device, or other types of hardware may be used. For example, as shown in FIG. 6, the computing system (600) may include one or more computer processors (602), non-persistent storage (604) (e.g., volatile memory, such as random access memory (RAM), cache memory), persistent storage (606) (e.g., a hard disk, an optical drive such as a compact disk (CD) drive or digital versatile disk (DVD) drive, a flash memory, etc.), a communication interface (612) (e.g., Bluetooth interface, infrared interface, network interface, optical interface, etc.), and numerous other elements and functionalities.

The computer processor(s) (602) may be an integrated circuit for processing instructions. For example, the computer processor(s) may be one or more cores or micro-cores of a processor. The computing system (600) may also include one or more input devices (610), such as a touchscreen, keyboard, mouse, microphone, touchpad, electronic pen, or any other type of input device.

The communication interface (612) may include an integrated circuit for connecting the computing system (600) to a network (not shown) (e.g., a local area network (LAN), a wide area network (WAN) such as the Internet, mobile network, or any other type of network) and/or to another device, such as another computing device.

Further, the computing system (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (602), non-persistent storage (604), and persistent storage (606). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

The computing system or group of computing systems described in FIG. 6 may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope of the disclosure. The processes may be part of the same or different application and may execute on the same or different computing system.

Rather than or in addition to sharing data between processes, the computing system performing one or more embodiments of the disclosure may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosure, may extract one or more data items from the obtained data. For example, the extraction may be performed as follows by the computing system (600) in FIG. 6. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 6, while performing one or more embodiments of the disclosure, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the disclosure, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 6 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 6 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents only a few examples of functions performed by the computing system of FIG. 6. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A system, comprising:
an optical source;
an adjustable spatial light modulator coupled to the optical source;
a medium coupled to the adjustable spatial light modulator;
a first beam splitter coupled to the optical source and the adjustable spatial light modulator, wherein the first beam splitter is configured to generate a first optical signal and a second optical signal using the optical source;
an optical detector coupled to the first beam splitter and the medium,
wherein the optical detector is configured to obtain a combined optical signal comprising a resulting optical signal and the second optical signal, and
wherein the resulting optical signal is produced by transmitting the first optical signal through the medium at a predetermined spatial light modulation using the adjustable spatial light modulator; and
a controller coupled to the optical detector and the adjustable spatial light modulator,
wherein the resulting optical signal is generated based on error data regarding an electronic model, and
wherein the controller is configured to train the electronic model using a plurality of synthetic gradients based on the combined optical signal.

2. The system of claim 1,
wherein the adjustable spatial light modulator is a digital micromirror device,
wherein the digital micromirror device is configured to receive a control signal from the controller, and
wherein the control signal adjusts the predetermined spatial modulation according to the error data.

3. The system of claim 1,
wherein the medium is a diffusive physical medium.

4. The system of claim 1,
wherein the electronic model is a deep neural network comprising three or more hidden layers, and
wherein the electronic model is trained using a direct feedback alignment algorithm.

5. The system of claim 1,
wherein the controller is an application specific integrated circuit (ASIC).

6. The system of claim 1,
wherein the optical source is a laser device configured to generate a continuous wave (CW) signal, and
wherein the predetermined spatial light modulation corresponds to a change of an amplitude at a location within a two-dimensional spatial distribution of an input optical signal.

7. The system of claim 1, further comprising:
a phase modulation system coupled to the first beam splitter and the optical detector,
wherein the second optical signal is a reference optical signal that is phase-shifted by the phase modulation system.

8. The system of claim 1, further comprising:
an interferometer coupled to the optical source and the optical detector,
wherein the interferometer comprises a first interferometer arm configured to transmit the first optical signal to the medium using the adjustable spatial light modulator,
wherein the interferometer further comprises a second interferometer arm configured to transmit the second optical signal to a second beam splitter, and
wherein the resulting optical signal and the second optical signal are combined in the second beam splitter to produce the combined optical signal.

9. The system of claim 1,
wherein the optical detector is a camera device comprising a plurality of complementary metal-oxide semiconductor (CMOS) sensors, and
wherein the optical detector is configured to generate an optical image using the combined optical signal.

10. A method, comprising:
determining, using a computer processor, first error data of an electronic model using training data and predicted data that is generated by the electronic model;
obtaining, by the computer processor and from an optical detector, optical data regarding a first combined optical signal comprising a reference optical signal and a resulting optical signal,
wherein the resulting optical signal is produced by transmitting an optical signal through a medium at a predetermined light modulation based on the first error data;
determining, using the computer processor, a first plurality of synthetic gradients based on the optical data, the electronic model, and the training data; and
updating, using the computer processor, the electronic model using the first plurality of synthetic gradients.

11. The method of claim 10, further comprising:
transmitting a control signal to an adjustable spatial light modulator in an optical system,
wherein the adjustable spatial light modulator comprises a digital mirror device, and
wherein the control signal causes the adjustable spatial light modulator to change an input optical signal to have the predetermined light modulation.

12. The method of claim 10, further comprising:
obtaining, from the optical detector, output optical data regarding a second combined optical signal comprising a second resulting signal and a second reference optical signal;
determining, using Fourier transform processing, a speckle field from the output optical data,
wherein the speckle field corresponds to a transmission matrix of the medium that produces the second resulting signal.

13. The method of claim 10, further comprising:
obtaining, from the optical detector, output optical data regarding a second combined optical signal comprising a second resulting signal and a second reference optical signal;
determining, using combined field quadrature processing, a speckle field from the output optical data,
wherein an amount of phase-shift of the second reference optical signal is adjusted to determine the speckle field.

14. The method of claim 10, further comprising:
transmitting a control signal to a phase modulation system coupled to a beam splitter to generate two or more optical images,
wherein the beam splitter generates a first optical signal and a second optical signal, wherein the first optical signal is transmitted through the medium to produce the resulting signal, wherein the second optical signal is phase-shifted by the phase modulation system to produce the reference optical signal, and wherein the control signal causes the phase modulation system to adjust a predetermined amount of phase-shifting within the reference optical signal.

15. The method of claim 10, further comprising:

determining whether the electronic model satisfies a predetermined criterion based on second error data, and determining, in response to the electronic model failing to satisfying the predetermined criterion, a second plurality of synthetic gradients for updating the electronic model, wherein the electronic model is updated until the second error data converges to the predetermined criterion.

16. The method of claim 10, wherein the electronic model is a deep neural network comprising three or more hidden layers, wherein the first plurality of synthetic gradients are determined using a direct feedback alignment algorithm, and wherein the computer processor is an application specific integrated circuit (ASIC).

17. The method of claim 10, wherein the first error data is an error vector that is generated using a cross-entropy function.

18. The method of claim 10, further comprising:

determining an advertisement recommendation using user data and a trained model that is generated from the electronic model using the first plurality of synthetic gradients.

19. A non-transitory computer readable medium storing instructions executable by a computer processor, the instructions comprising functionality for:

determining error data of an electronic model using training data and predicted data that is generated by the electronic model;

obtaining, from an optical detector, optical data regarding a combined optical signal comprising a reference optical signal and a resulting optical signal, wherein the resulting optical signal is produced by transmitting an optical signal through a medium at a predetermined light modulation based on the error data;

determining a plurality of synthetic gradients based on the optical data; and updating the electronic model using the plurality of synthetic gradients.

* * * * *